United States Patent
Serpinet et al.

[11] Patent Number: 6,034,858
[45] Date of Patent: Mar. 7, 2000

[54] CURRENT TRANSFORMER, TRIP DEVICE AND CIRCUIT BREAKER COMPRISING SUCH A TRANSFORMER

[75] Inventors: Marc Serpinet, Montchaboud; Laurent Previeux, Grenoble, both of France

[73] Assignee: Schneider Electric SA, France

[21] Appl. No.: 08/955,702

[22] Filed: Oct. 23, 1997

[30] Foreign Application Priority Data

Nov. 7, 1996 [FR] France .................................. 96 13833

[51] Int. Cl.⁷ ...................................................... H02H 3/00
[52] U.S. Cl. ............................................. 361/93.6; 361/38
[58] Field of Search .................................. 361/93.1, 93.6, 361/115, 35, 38; 336/134, 178, 173; 335/177–179

[56] References Cited

U.S. PATENT DOCUMENTS

| | | | |
|---|---|---|---|
| 3,794,889 | 2/1974 | Clausing | 361/87 |
| 3,932,791 | 1/1976 | Oswald | 317/33 SC |
| 4,157,520 | 6/1979 | Moates et al. | 335/230 |
| 4,454,557 | 6/1984 | Hurley | 361/93 |
| 5,495,219 | 2/1996 | Arnold | 335/172 |

FOREIGN PATENT DOCUMENTS

| | | |
|---|---|---|
| 2733376 | 10/1996 | France . |
| 432812 | 8/1926 | Germany . |
| 716399 | 1/1942 | Germany . |

*Primary Examiner*—Jeffrey Gaffin
*Assistant Examiner*—Kim Huynh
*Attorney, Agent, or Firm*—Parkhurst & Wendel, L.L.P.

[57] ABSTRACT

The current transformer comprises a magnetic circuit associated to a primary conductor and a secondary winding connected to a trip relay. The magnetic circuit comprises a mobile part and a fixed part. The mobile part goes from an open position to a closed position when a primary current flowing in the primary conductor exceeds a preset value. The change of position of the mobile part makes the magnetic flux in the magnetic circuit vary which induces a secondary current in the secondary winding to actuate the trip relay. Application, notably to trip devices and circuit breakers.

10 Claims, 4 Drawing Sheets

CURRENT TRANSFORMER, TRIP DEVICE AND CIRCUIT BREAKER COMPRISING SUCH A TRANSFORMER

BACKGROUND OF THE INVENTION

The invention relates to a current transformer comprising a magnetic circuit connected to a primary conductor, and a secondary winding designed to supply a secondary current to actuate a trip relay.

Current transformers of known types transform a primary current of strong intensity flowing in a conductor of a power system to be protected into a secondary current supplying circuitry and a trip relay. These transformers generally operate with alternating currents. In certain trip devices, the alternating secondary current is also used to supply a measurement signal to protection circuits.

For direct current power systems, transformers of known types do not enable a measurement signal or sufficient energy to supply circuitry or a trip relay to be efficiently supplied. In this case, an auxiliary voltage supply and an additional current measurement device are necessary. However, a large short-circuit may occur near to a circuit breaker comprising an auxiliary power supply. The power system voltage can then drop and cause a decrease of the voltage supplied by the auxiliary power supply. Such a decrease can give rise to tripping faults of the trip devices and be insufficient to supply the trip relay to open the circuit breaker.

Transformers can supply a secondary current when the variation of the primary current is large, even when said primary current has a DC polarity. The secondary current depends on the variation of the primary current. It can be used to actuate a trip relay of a circuit breaker if said variation is large. However, such a trip on a short-circuit only occurs above a high value of the derivative of the primary current.

SUMMARY OF THE INVENTION

The object of the invention is to achieve a current transformer, notably for direct current, supplying a secondary current when the primary current exceeds a preset value, and a trip device and a circuit breaker comprising such a transformer. According to the invention, the magnetic circuit of the transformer comprises a mobile part and a fixed part, the mobile part having a first open position opening the magnetic circuit with an air gap of large distance and a second closed position closing the magnetic circuit with a small or nil air gap, said mobile part going from the first open position to the second closed position when a primary current flowing in the primary conductor exceeds a preset value.

In a preferred embodiment of the invention, the transformer comprises adjustment means comprising a magnetic shunt with an air gap arranged as a branch-off on the mobile part of the magnetic circuit.

According to a first particular embodiment, the mobile part is a blade connected to a return spring, said blade being positioned in its first open position by bearing means and positioned in its second closed position in contact with a fixed part of the magnetic circuit.

According to a second particular embodiment, the mobile part is a plunger sliding with respect to a first fixed part of the magnetic circuit, said plunger having an air gap of large distance with respect to a second fixed part of the magnetic circuit when it is in its first open position and a small or nil air gap with respect to said second fixed part of the magnetic circuit when it is in its second closed position.

Preferably, a coil of the secondary winding is disposed around the sliding plunger.

For strong currents of the primary conductor, the magnetic circuit comprises distributed air gaps.

A trip device according to the invention comprises at least such a transformer and a trip relay connected to a secondary winding of said transformer.

In one embodiment, a trip device comprises means for detection connected to the transformer to detect movement of the mobile part of the magnetic circuit, said means being connected to the trip relay to control actuation of the relay when a secondary current is supplied by the transformer.

Preferably, the trip device comprises a processing unit connected to the trip relay and measuring means, associated to the transformer and connected to the processing unit, supplying a signal representative of a current flowing in the primary conductor.

A circuit breaker, according to the invention, comprises at least such a transformer, and adjustment devices connected to the transformer to adjust the preset current value for which the mobile part goes from its first open position to its second closed position.

BRIEF DESCRIPTION OF THE DRAWINGS

Other advantages and features will become more clearly apparent from the following description of particular embodiments of the invention given as non-restrictive examples only and represented in the accompanying drawings in which.

DETAILED DESCRIPTION OF THE PREFERRED EMBODIMENT

Figure 1:
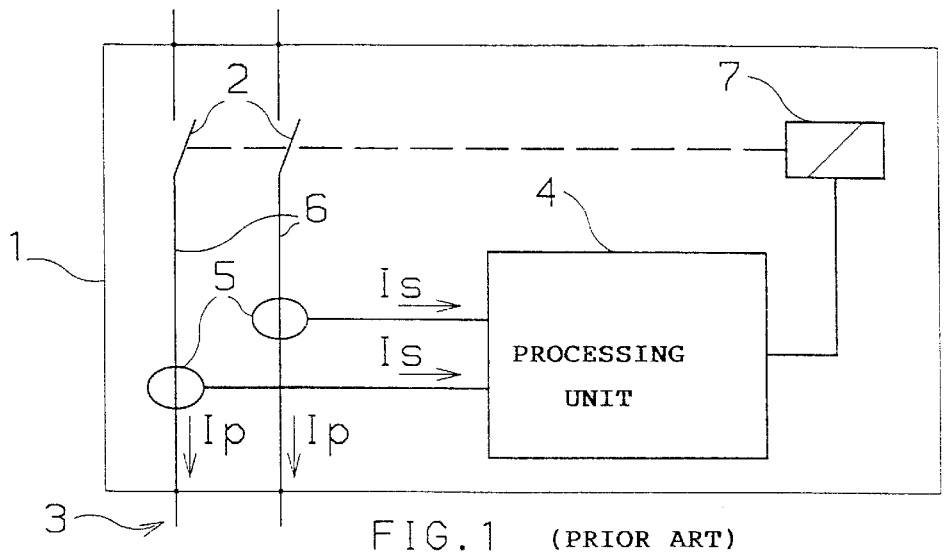
FIG. 1 represents a block diagram of a circuit breaker comprising a trip device and transformers of known types.

In the diagram of FIG. 1, a state of the art circuit breaker 1 comprises contacts 2 to establish or interrupt the flow of electrical current in a power system 3 to be protected. The circuit breaker also comprises a processing unit 4 receiving a secondary current Is supplied by current transformers 5 arranged on primary conductors 6 supplying the power system 3.

The processing unit 4 processes the secondary current signal and commands a trip relay 7 when said signal exceeds a preset threshold for a preset time. The relay 7 actuates opening of the contacts 2 via an opening mechanism.

The current transformers 5 supply the measurement signal and the energy necessary for operation of the processing unit and relay. Generally, transformers of known type operate well if the current which passes through their primary conductor is alternating current. But if the primary current is direct, the current supplied for the processing unit and command of the relay is not sufficient.

The power supply to the central unit can be provided by an auxiliary power supply circuit. However, functions of instantaneous tripping on short-circuit must be able to be performed even in the absence of auxiliary power supplies.

Figure 2:
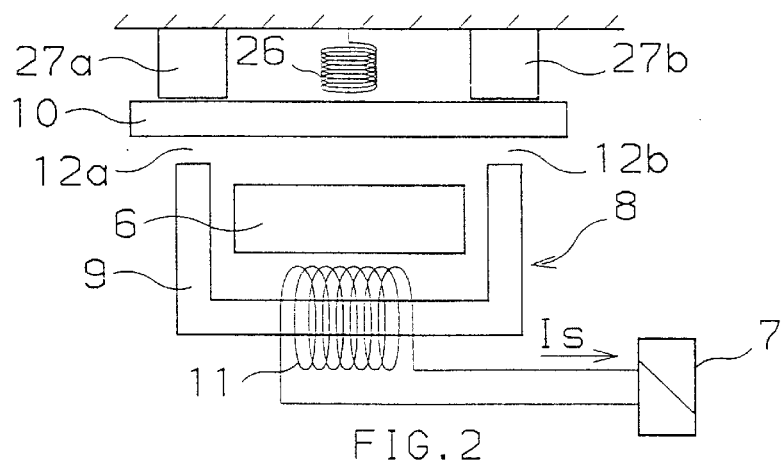
FIG. 2 represents a diagram of a transformer according to a first embodiment of the invention.

FIG. 2 shows an embodiment of a transformer according to the invention able to supply energy to a relay without using an auxiliary power supply. This type of transformer is particularly well suited to currents with DC polarity but it can also be used in alternating current.

The transformer of FIG. 2 comprises a magnetic circuit 8 comprising a fixed part 9 and a mobile part 10. The whole of the magnetic circuit surrounds a primary conductor 6 in which a current Ip of a power system to be protected is flowing. A secondary winding 11 coiled onto a part of the magnetic circuit 8 is connected to the trip relay 7.

The mobile part of the magnetic circuit in the form of a blade is represented in an open position. In this position, the mobile part 10 is separated from the fixed part 9 by two air gaps 12a and 12b situated at two ends of said fixed part. The distance of the air gaps 12a and 12b is large so long as the mobile part is in the open position. The mobile part is kept in the open position by a return spring 26 and by two stops 27a and 27b.

So long as the current Ip flowing in the primary conductor 6 is lower than a preset value SIp, the mobile part 10 remains in its open position. Then, as soon as the current Ip of the primary conductor exceeds the threshold of the preset value SIp, the mobile part is attracted towards the fixed part. A large flux variation is then created in the magnetic circuit. This flux variation induces a secondary current Is in the winding 11 which supplies the trip relay 7 to bring about opening of the contacts 2.

The threshold of attraction of the mobile part towards the fixed part depends notably on the distance of the air gaps. Adjustment devices of the threshold of the preset current value SIp can act for example on the stops to vary the distance of the air gaps.

Figure 3:
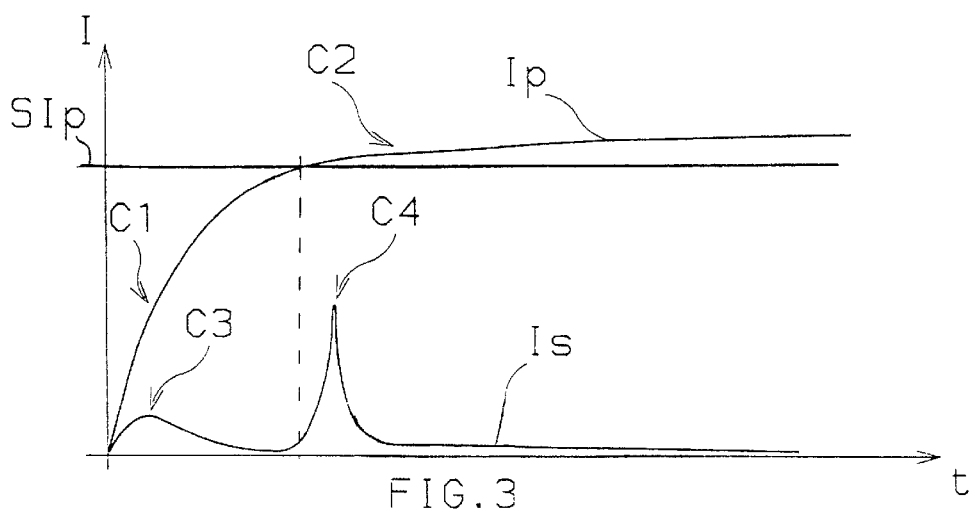
FIG. 3 represents curves of operation of a transformer according to an embodiment of the invention.

FIG. 3 shows curves illustrating operation of a transformer according to an embodiment of the invention. The primary current Ip increases rapidly in a first part C1 of the curve, then the increase is lesser in a second part C2. If the increase of the current Ip is fast, the variation of the current induces in the transformer a flux variation and a secondary current Is represented by the part C3 on the curve of Is. When the current Ip exceeds a preset threshold SIp, the mobile part 10 of the magnetic circuit is attracted towards the fixed part 9. A large flux variation then occurs in the magnetic circuit generating a high secondary current Is in the secondary winding 11. This secondary current, represented in the part C4 of the curve of Is in FIG. 3, is supplied to the relay 7 to command opening of the contacts 2.

In preferred embodiments of a transformer according to the invention, the mobile part is a sliding plunger 13. FIGS. 4 to 7 show transformers comprising mobile parts with sliding plungers 13. In these embodiments, the plunger 13 slides in an opening 14 of a first fixed part 9a of the magnetic circuit and inside a coil of the secondary winding 11. A spring 15 is arranged between one end of the plunger and a second fixed part 9b of the magnetic circuit to maintain an air gap 12 between the mobile part 13 represented by the plunger and said fixed part 9b.

Figure 4:
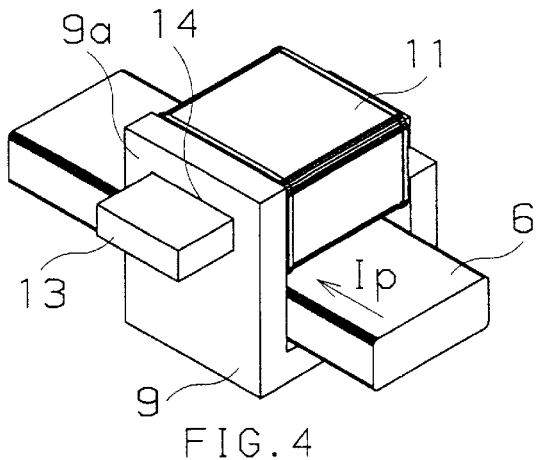
FIGS. 4 and 5 represent views of a transformer according to a second embodiment of the invention.
Figure 5:
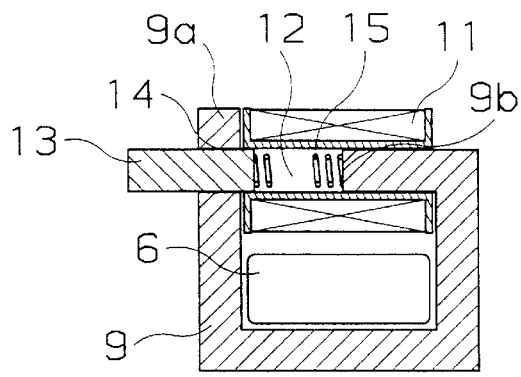
Figure 6:
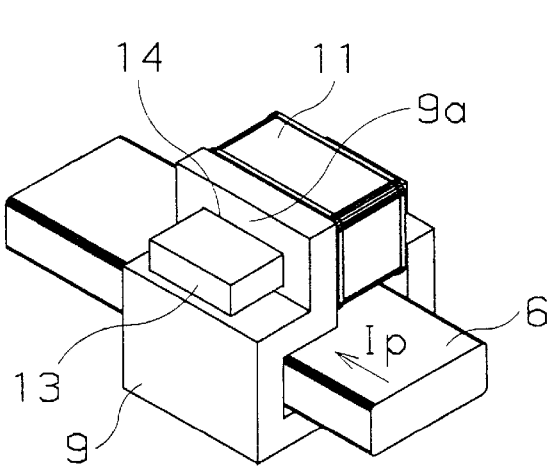
FIGS. 6 and 7 represent views of a transformer according to an alternative version of the embodiment of FIGS. 4 and 5.
Figure 7:
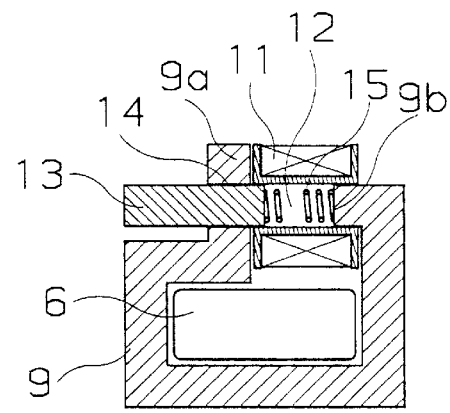

The transformer of FIGS. 6 and 7 has a more compact shape than that of FIGS. 4 and 5. These different shapes are designed to match the volumes set aside for the transformers in the circuit breakers.

Adjustment of the preset threshold acts, for example, on the distance of the air gap 12 when the mobile part represented by the plunger 13 is in the open position. However, modification of the distance of the air gap is liable to modify the values of the pulses of the secondary current Is as well. Moreover, adjusting the position of the plunger may prove complex depending on the arrangement of the transformers in the circuit breaker.

In embodiments of a transformer according to the invention, adjustment of the threshold is advantageously performed by means of a magnetic shunt with an air gap arranged as a branch-off on the mobile part of the magnetic circuit.

Figure 8:
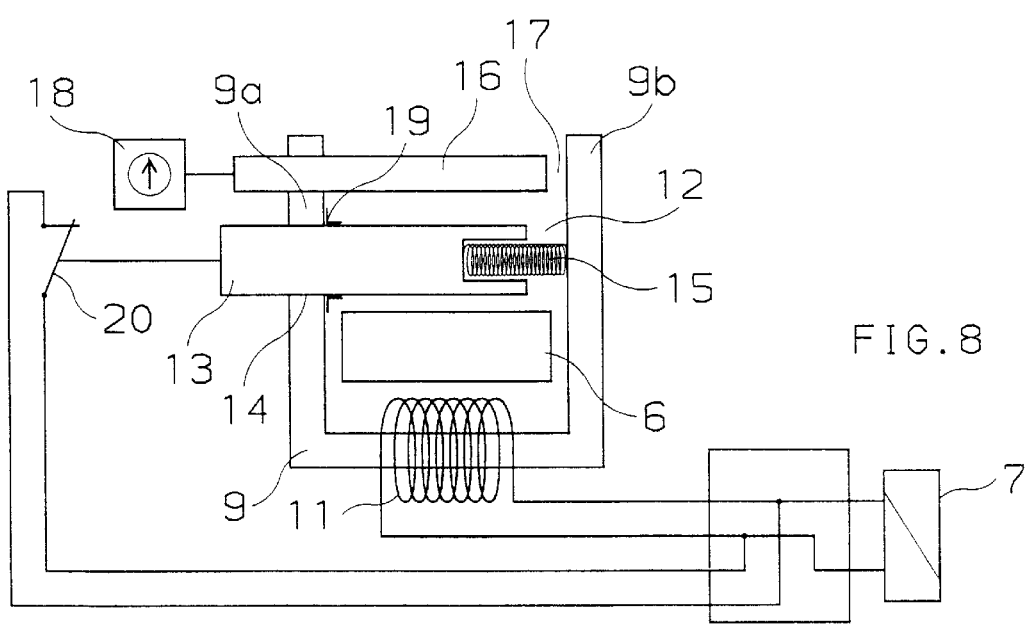
FIG. 8 represents a diagram of a transformer according to an embodiment of the invention comprising a threshold adjustment.

A transformer comprising an adjustment device with a shunt is represented in FIG. 8. The adjustment device comprises a magnetic shunt 16 sliding with respect to a first fixed part 9a of the magnetic circuit and having an air gap 17 with respect to a second fixed part 9b of said magnetic circuit opposite to the first part 9a.

The shunt 16 is for example mechanically connected to adjustment parts 18 of a circuit breaker.

In this transformer, the mobile part 13 with its air gap 12 and the magnetic shunt 16 with its air gap 17 are arranged in parallel between the first fixed part 9a and the second fixed part 9b of the magnetic circuit. The distribution of the magnetic flux between the shunt and the plunger depends on the distance of the air gaps respectively 17 and 12. The air gap 12 of the mobile part in its open position is determined by a stop 19 which positions the plunger when the spring 15 pushes said plunger towards the first fixed part 9a.

If the shunt is distant from the second fixed part 9b, the air gap 17 has a large distance and the magnetic flux passes essentially via the plunger and air gap 12. The threshold of attraction of the plunger is then low, and the secondary current is generated for a low preset value of the primary current.

In the case of a high threshold setting, the shunt 16 is close to the second fixed part 9b. The air gap 16 then has a reduced distance and a large part of the magnetic flux passes via the shunt 17. The magnetic field in the air gap 12 is then low. To attract the mobile part towards the fixed part of the magnetic circuit, the primary current Ip must be higher.

When the primary current varies without the threshold being exceeded, it is preferable not to supply the relay. For example, in FIG. 3, the part C1 of the primary current Ip generates a secondary current Is represented by the part C3 of the curve. This current is liable to supply the relay whereas the threshold SIp has not been exceeded.

To prevent the relay 7 from being excited other than when the threshold is exceeded, the transformer of FIG. 8 comprises a position detector 20 associated to the plunger 13 of the mobile part.

The detector 20 is, for example, an electrical contact connected to the relay 7 or to the winding 11 to inhibit command of the relay by the secondary current Is so long as the plunger is not attracted. In the diagram of FIG. 8, the contact 20 is closed whereas the mobile part is in the open position. In this position currents Is generated in the winding 11 are branched off into the contact 20 and the relay is not excited. If the threshold is exceeded, the mobile part 13 is attracted towards the fixed part 9b and the contact 20 is opened. The current Is generated in the winding 11 by the flux variation, due to the attraction of the plunger, is sent to the relay 7 without being short-circuited by the contact.

Use of the detector 20 is also useful when the transformer is used in alternating current. The detector then enables induced alternating currents and secondary currents generated by the position change of the mobile part to be differentiated.

Figure 9:
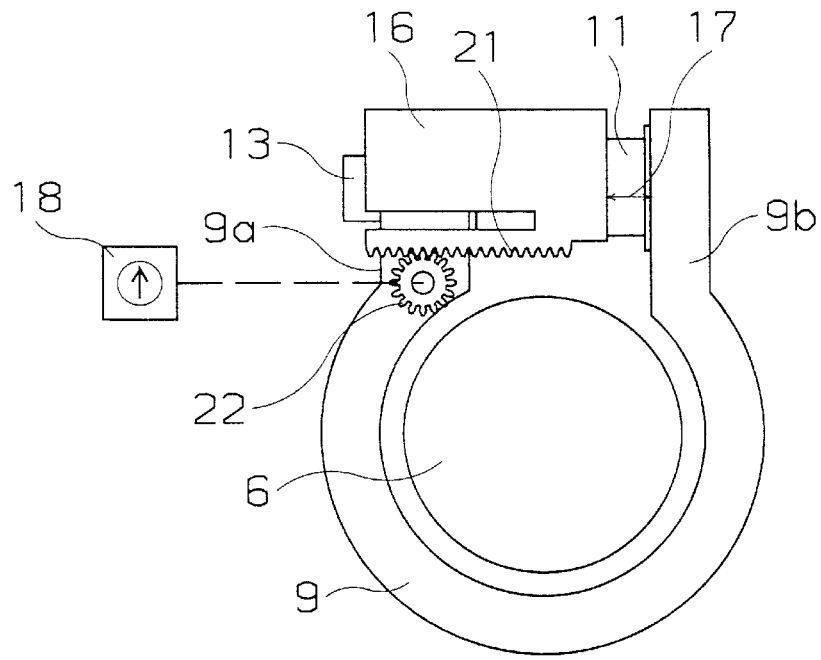
FIG. 9 represents a view of a transformer according to FIG. 8 comprising a threshold adjustment.

FIG. 9 shows a particular embodiment of a transformer comprising a threshold adjustment device. The magnetic circuit of this transformer has an appreciably circular shape suited to the shape of the primary conductor 6. The sliding plunger 13 slides inside the coil of the winding 11 and the shunt 16 is in parallel on the assembly formed by the plunger 13 and winding 11. In this embodiment, the shunt 16 comprises a toothed part 21 in the form of a crown-wheel. The adjustment device 12 acts on the shunt by means of a cog-wheel 22 which acts on the toothed part of the shunt.

Figure 10:
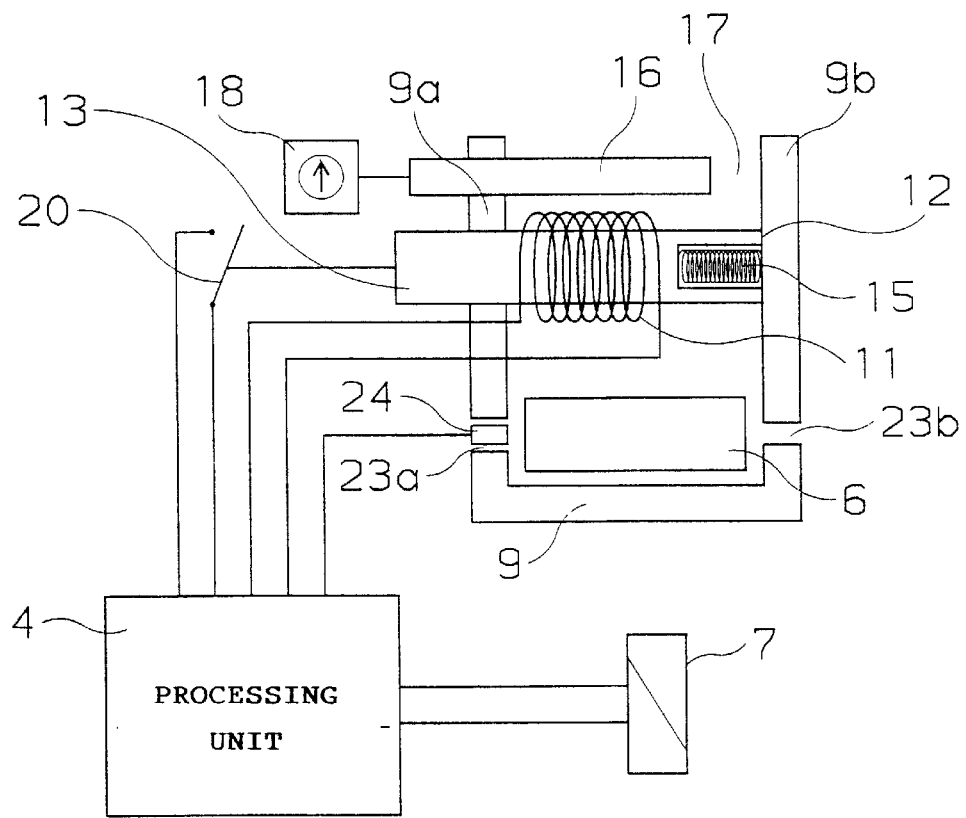
FIG. 10 represents a diagram of a transformer according to an embodiment of the invention comprising a sensor sensitive to a magnetic quantity.

FIG. 10 represents a diagram of another embodiment of a transformer according to the invention. The fixed part of the magnetic circuit 9 of the transformer comprises air gaps 23a, 23b to reduce the magnetic flux flowing in the circuit 9. These air gaps prevent saturation of the magnetic circuit, notably when a strong current Ip has to flow in the primary conductor 6. The air gaps 23a and 23b are in series with the air gap 12 of the mobile part 13. They are also used to determine the current threshold for which attraction of the mobile part takes place.

The mobile part is represented in its closed position, the air gap 12 being very small or nil.

The transformer represented in FIG. 10 also comprises a sensor 24 sensitive to the magnetic field inserted in an air gap 23a of the fixed part 9 of the magnetic circuit. This sensor 24, connected to the processing unit 4, is preferably a Hall effect or magnetoresistance sensor. The signals supplied by the sensor 24 to the processing unit are representative of the flux in the magnetic circuit and of the primary current Ip.

In FIG. 10, the transformer, processing unit and relay form a trip device. The processing unit receives the signals supplied by the sensor and commands the relay 7 if said signals exceed preset thresholds during preset times. For this type of operation, the processing unit is supplied by an auxiliary power supply. The tripping functions performed by the processing unit are notably thermal or long delay protection, short delay protection and instantaneous protection.

To perform short delay protection or instantaneous protection even without an auxiliary power supply, the processing unit is connected to the secondary winding 11 to receive the secondary current for operation of the relay 7. A position detector 20 can also be connected to the processing unit to prevent command of the relay by a secondary current Is so long as the fixed part 13 is not attracted.

Figure 11:
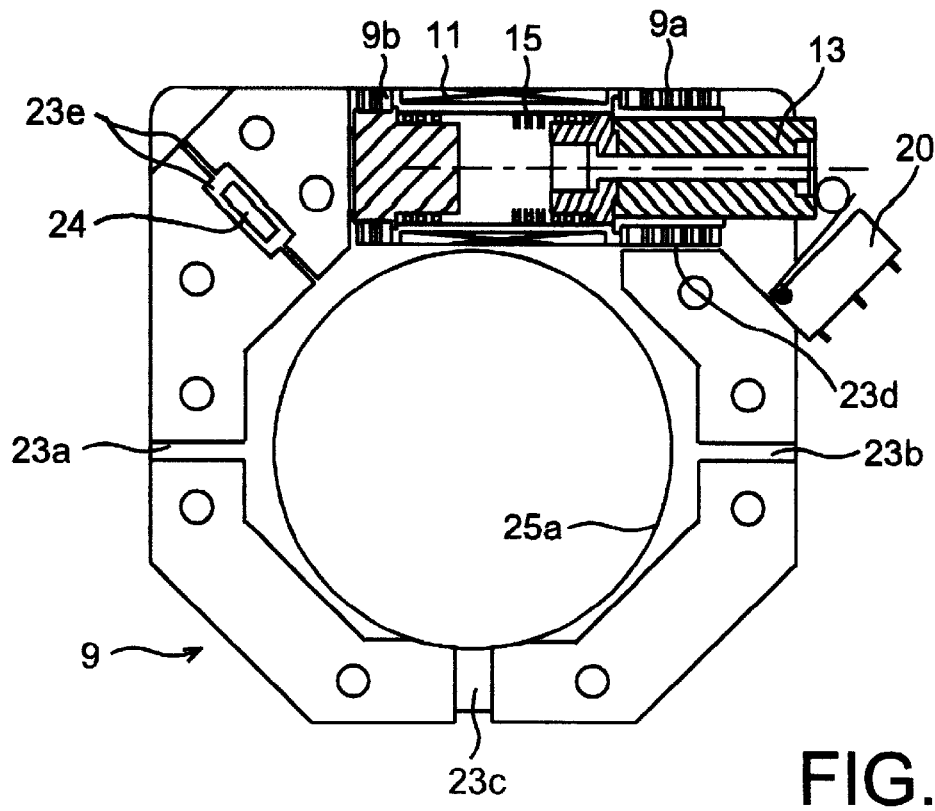
FIGS. 11 and 12 represent views of a transformer according to FIG. 10 comprising distributed air gaps.
Figure 12:
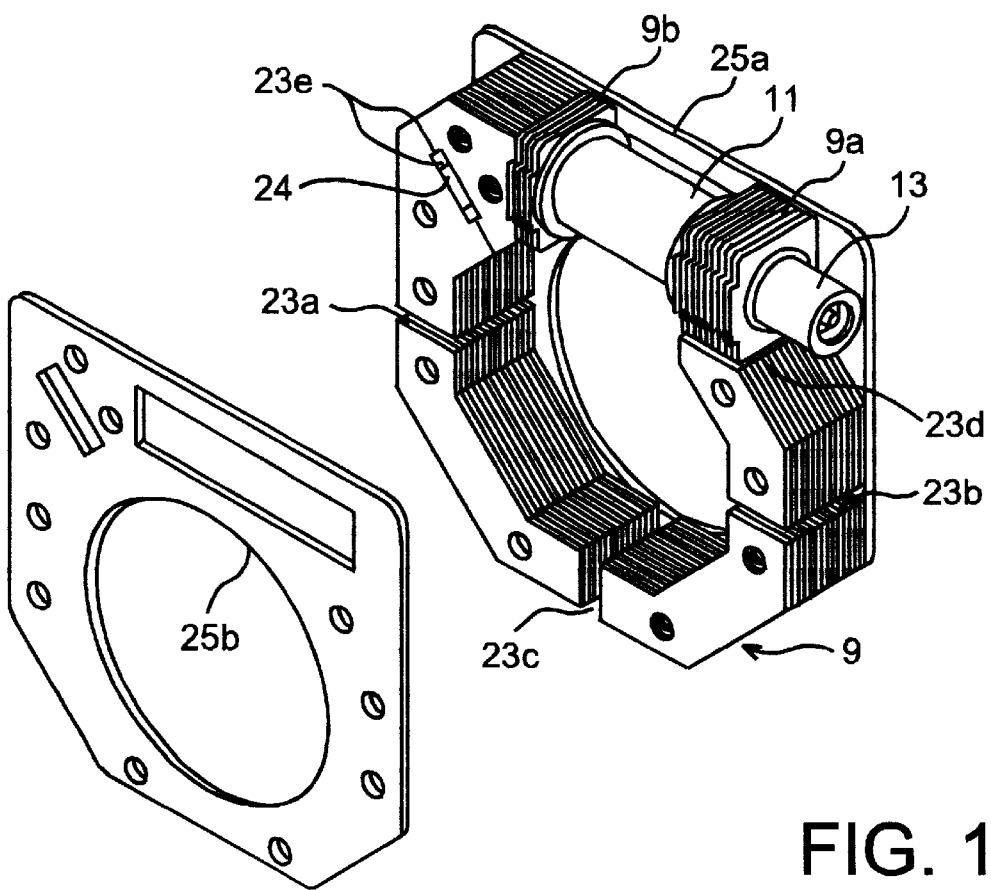

FIGS. 11 and 12 show two views of a transformer according to an embodiment of the invention comprising several air gaps 23a, 23b, 23c, 23d and 23e distributed over the fixed part of the magnetic circuit 9. The fixed part being broken up by air gaps, the transformer comprises two flanges 25a and 25b to secure said fixed part.

The air gap 23e is designed to receive a sensor 24. It has a suitable shape enabling the magnetic field applied to the sensor 24 to be reduced when a strong primary current has to flow in the conductor 6.

A first part of the air gap has a large distance to receive the sensor 24 and at least a second part, in parallel on the first, at a small distance to divert some of the magnetic flux which is established in the magnetic circuit. Thus, by diverting magnetic flux by the second part, the magnetic field located in the first part comprising the sensor 24 is smaller. The sensor can then supply a measurement signal over a wide operating range. Furthermore, the field in the air gap is uniform and the sensor no longer requires a very precise positioning in the air gap to guarantee a correct response.

The transformers described above are well suited to DC power system protections, but they can also be advantageously used for protection of AC power systems.

The secondary winding 11 can comprise one or more coils arranged on the fixed part, the mobile part or both parts.

The mobile parts of the magnetic circuit may have other forms than those shown in the figures. For example, these parts can also have the forms of blades pivoting around a spindle.

In transformers according to FIGS. 10, 11 or 12, threshold adjustment can also be performed by varying at least one air gap of the fixed part of the magnetic circuit, or the tension of the return spring.

We claim:

1. A current transformer for monitoring a current level in a primary conductor and for providing a tripping signal to a relay in said primary conductor when an over current condition exists in said primary conductor, said current transformer comprising:

a magnetic circuit for monitoring a magnitude of current flowing through a primary conductor, said magnetic circuit comprising a fixed element, a movable element, and air gaps located between said fixed element and said movable element, said movable element being movable towards said fixed element when an over current condition exists thereby reducing a size of said air gaps;

biasing means for biasing said movable element to an open or closed position; and a secondary winding wound around at least a portion of said fixed element for providing a tripping signal to said relay to open said primary conductor;

said elements arranged so that when said movable element moves towards said fixed element a large flux variation in said magnetic circuit is produced thereby inducing a current in said secondary winding.

2. The current transformer according to claim 1 comprising adjustment means comprising a magnetic shunt with an air gap arranged as a branch-off on the movable element of the magnetic circuit.

3. A circuit breaker comprising at least one transformer according to claim 2, and adjustment devices connected to the transformer to adjust a preset current value for which the movable element goes from its first open position to its second closed position.

4. A trip device comprising at least one transformer according to claims 1 to 2 and a trip relay connected to a secondary winding of said transformer.

5. The trip device according to claim 4 comprising means for detection connected to the transformer to detect movement of the movable element of the magnetic circuit, said means being connected to the trip relay to control actuation of the relay when a secondary current is supplied by the transformer.

6. The trip device according to claim 4 comprising a processing unit connected to the trip relay and a measuring means, associated to the transformer and connected to the processing unit, supplying a signal representative of a current flowing in the primary conductor.

7. The current transformer according to claim 1 wherein the movable element is a blade connected to a return spring, said blade being positioned in a first open position by biasing means and positioned in a second closed position in contact with the fixed element of the magnetic circuit.

8. The current transformer according to claim 1 wherein the movable element is a plunger slidable with respect to a first fixed part of the magnetic circuit, said plunger having an air gap of large distance with respect to a second fixed part of the magnetic circuit when said plunger is in a first open position and little or no air gap with respect to said second fixed part of the magnetic circuit when said plunger is in its second closed position.

9. The current transformer according to claim 8 wherein a coil of the secondary winding is disposed around the sliding plunger.

10. The current transformer according to claim 1 wherein the magnetic circuit comprises distributed air gaps.

* * * * *